United States Patent
Zhang et al.

(10) Patent No.: US 9,607,812 B2
(45) Date of Patent: *Mar. 28, 2017

(54) SPUTTERING TARGET AND METHOD FOR PRODUCING SAME

(71) Applicant: MITSUBISHI MATERIALS CORPORATION, Tokyo (JP)

(72) Inventors: Shoubin Zhang, Sanda (JP); Keita Umemoto, Sanda (JP); Masahiro Shoji, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 9 days.

This patent is subject to a terminal disclaimer.

(21) Appl. No.: 14/380,610

(22) PCT Filed: Feb. 15, 2013

(86) PCT No.: PCT/JP2013/054637
§ 371 (c)(1),
(2) Date: Aug. 22, 2014

(87) PCT Pub. No.: WO2013/125716
PCT Pub. Date: Aug. 29, 2013

(65) Prior Publication Data
US 2015/0014156 A1    Jan. 15, 2015

(30) Foreign Application Priority Data

Feb. 24, 2012 (JP) .................................. 2012-039042
Jan. 16, 2013 (JP) .................................. 2013-005369

(51) Int. Cl.
C23C 14/35    (2006.01)
B22F 3/10    (2006.01)
(Continued)

(52) U.S. Cl.
CPC ............ *H01J 37/3429* (2013.01); *B22F 3/10* (2013.01); *C22C 1/0425* (2013.01);
(Continued)

(58) Field of Classification Search
CPC .... B22F 3/10; B22F 2201/20; B22F 2301/00; C22C 1/0425; C22C 32/0089;
(Continued)

(56) References Cited

U.S. PATENT DOCUMENTS

| | | | |
|---|---|---|---|
| 7,935,558 B1 | 5/2011 | Juliano et al. | |
| 8,795,489 B2 * | 8/2014 | Zhang | C22C 1/0425 204/298.13 |
| 8,968,491 B2 * | 3/2015 | Zhang | C22C 1/10 148/432 |

FOREIGN PATENT DOCUMENTS

| | | |
|---|---|---|
| EP | 2420590 A1 | 2/2012 |
| JP | 2010265544 A | 11/2010 |

(Continued)

OTHER PUBLICATIONS

International Search Report of PCT/JP2013/054637 dated May 7, 2013.

(Continued)

*Primary Examiner* — Rodney McDonald
(74) *Attorney, Agent, or Firm* — Locke Lord LLP

(57) ABSTRACT

Provided is a sputtering target which contains Na in high concentration and, despite this, is inhibited from discoloration, generating spots, and causing abnormal electrical discharge and which has high strength and rarely breaks. Also provided is a method for producing the sputtering target. The sputtering target has a component composition that contains 10 to 40 at % of Ga and 1.0 to 15 at % of Na as metal element components other than F, S, and Se, with the remainder composed of Cu and unavoidable impurities, (Continued)

wherein the Na is contained in the form of at least one Na compound selected from sodium fluoride, sodium sulfide, and sodium selenide. The sputtering target has a theoretical density ratio of 90% or higher, a flexural strength of 100 N/mm$^2$ or higher, and a bulk resistivity of 1 mΩ·cm or less. The number of 0.05 mm$^2$ or larger aggregates of the at least one of sodium fluoride, sodium sulfide, and sodium selenide present per cm$^2$ area of the target surface is 1 or less on average.

6 Claims, 5 Drawing Sheets

(51) Int. Cl.
| | | |
|---|---|---|
| H01J 37/34 | (2006.01) | |
| C23C 14/08 | (2006.01) | |
| C23C 14/34 | (2006.01) | |
| C22C 1/04 | (2006.01) | |
| C22C 32/00 | (2006.01) | |
| C23C 14/06 | (2006.01) | |

(52) U.S. Cl.
CPC ...... *C22C 32/0089* (2013.01); *C23C 14/0623* (2013.01); *C23C 14/08* (2013.01); *C23C 14/087* (2013.01); *C23C 14/3414* (2013.01); *C23C 14/35* (2013.01); *B22F 2201/20* (2013.01); *B22F 2301/00* (2013.01); *B22F 2999/00* (2013.01)

(58) Field of Classification Search
CPC . C23C 14/0623; C23C 14/08; C23C 14/3414; C23C 14/087; C23C 14/35; H01J 37/3429
USPC .......... 204/298.12, 298.13; 419/23
See application file for complete search history.

(56) References Cited

FOREIGN PATENT DOCUMENTS

| | | |
|---|---|---|
| JP | 201126003 A | 8/2011 |
| TW | 201109458 A | 3/2011 |
| TW | 201139702 A | 11/2011 |
| WO | WO-2011010529 A1 | 1/2011 |
| WO | WO-2011083647 A1 | 7/2011 |
| WO | WO-2011114657 A1 | 9/2011 |
| WO | WO-2012147985 A1 | 11/2012 |

OTHER PUBLICATIONS

Tanaka, Tooru et al; Characterization of Cu (In$_x$Ga$_{1-x}$)$_2$Se$_{3.5}$ thin films prepared by rf sputtering; Solar Energy Materials and Solar Cells, 1998, vol. 50, pp. 13-18.

Tanaka Tooru et al; Preparation of Cu(In,Ga)2Se$_{3.5}$ thin films by radio frequency sputtering from stoichiometric Cu(In,Ga)Se$_2$ and Na$_2$Se mixture target; J. Appl. Phys. vol. 81, No. 11, 1997, pp. 7619-7622.

Notice of Refusal for Taiwan Patent Application No. 102106207 dated Feb. 13, 2015.

Supplementary European Search Report mailed Oct. 12, 2015, issued for the European patent application No. 13752289.2.

* cited by examiner (a)

(b)

(a)

(b)

(a)

(b)

# SPUTTERING TARGET AND METHOD FOR PRODUCING SAME

CROSS-REFERENCE TO RELATED APPLICATIONS

This application is a U.S. National stage application of PCT International Application No. PCT/JP2013/054637 filed Feb. 15, 2013, which claims the benefit of Japanese Patent Application No. 2012-039042 filed Feb. 24, 2012; and Japanese Patent Application No. 2013-005369, filed Jan. 16, 2013, the entire contents of these aforementioned applications are hereby incorporated herein by reference.

BACKGROUND OF THE INVENTION

Field of the Invention

The present invention relates to a sputtering target for use in forming a Cu—In—Ga—Se compound film (hereinafter abbreviated as "CIGS film") for forming a light absorbing layer of a thin-film solar cell, and a method for producing the same.

Description of the Related Art

In recent years, thin film solar cells made by using a chalcopyrite compound semiconductor have been practically employed. The thin-film solar cell made by using the compound semiconductor has a basic structure in which a Mo electrode layer serving as a positive electrode is formed on a sodalime glass substrate, a light absorbing layer consisting of a CIGS film is formed on the Mo electrode layer, a buffer layer consisting of ZnS, CdS, and the like is formed on the light absorbing layer, and a transparent electrode layer serving as a negative electrode is formed on the buffer layer.

As a method for forming the light absorbing layer described above, a method for depositing a film by vapor deposition is known. Although a light absorbing layer obtained by the method may exhibit high energy conversion efficiency, film deposition by vapor deposition attains slow deposition rate. Hence, when a film is deposited on a substrate having a large area, the uniformity of the in-plane distribution of the film thickness is readily reduced. Thus, a sputtering method for forming a light absorbing layer has been proposed.

As a sputtering method for forming the light absorbing layer, a method (so called "selenization method") has been proposed in which an In film is firstly deposited by sputtering using an In target, a Cu—Ga binary alloy film is deposited on the In film by sputtering using a Cu—Ga binary alloy target, and a stacked precursor film consisting of the obtained in film and the Cu—Ga binary alloy film is subject to heat treatment in a Selenium atmosphere to thereby form a CIGS film.

In order to improve the power generation efficiency of a light absorbing layer consisting of a CIGS film, the addition of Na to the light absorbing layer by diffusion from the alkaline glass substrate is known as effective means as disclosed in, for example, Non-Patent Document 1. However, in the case of a flexible CIGS solar cell based on a polymer film or the like instead of an alkaline glass, a supply of Na may undesirably be lost because there is no alkaline glass substrate.

Thus, for example, Patent Document 1 proposes a diffusion of Na from a lift-off layer to a light absorbing layer by providing the lift-off layer of sodium chloride in order to improve the photoelectric conversion characteristics of the flexible CIGS solar cell formed on the polymer film.

For the addition of Na, Non-Patent Documents 1 and 2 propose a method for depositing a sodalime glass between a Mo electrode layer and a substrate. However, when a sodalime glass is deposited as proposed in Non-Patent Documents, the number of manufacturing processes increases, resulting in a reduction in productivity.

Patent Document 2 proposes a method in which NaF is added to a Mo electrode layer so as to diffuse Na from the Mo electrode layer to the light absorbing layer. However, when NaF is added to the Mo electrode layer, a large amount of Na is concentrated between the Mo electrode layer and the substrate, so that interfacial separation between the Mo electrode layer and the substrate may occur.

Since it is difficult to control the amount of diffusion of Na from a glass substrate or the like, there is proposed a method for adding a Na compound directly to a light absorbing layer as a method for adding Na without Na diffusion. For example, Patent Document 3 proposes a method in which a diffusion barrier layer is disposed between a glass substrate and a light absorbing layer and then $Na_2S$ or $Na_2Se$ is added to the light absorbing layer while blocking diffusion of Na from the glass substrate so as to control the content of Na in the light absorbing layer.

In order to add a Na compound directly to a light absorbing layer, Patent Document 4 proposes a Cu—Ga sputtering target containing 0.05 to 1 at % of Na, wherein the Na is contained in the form of a NaF compound.

Here, Non-Patent Document 3 discloses a CIGS film to which 2% of Na is added, and thus, it has been found that a CIGS solar cell having a favorable power generation efficiency may be obtained even in the case of the addition of high concentration Na which has not been conventionally considered.

PRIOR ART DOCUMENTS

Patent Documents

[Patent Document 1] Japanese Unexamined Patent Publication No. 2009-49389
[Patent Document 2] Japanese Unexamined Patent Publication No. 2011-74418
[Patent Document 3] Japanese Unexamined. Patent Publication No. 2007-266626
[Patent Document 4] Japanese Unexamined Patent Publication No. 2011-117077

Non-Patent Document

[Non-Patent Document 1] Ishizuka, et al., "The current and future trends on the development of chalcopyrite thin film solar cells", Journal of the Vacuum Society of Japan, Vol 53, No. 1, 2010 p. 25
[Non-Patent Document 2] Ishizuka, et al., "Na-induced variations in the structural, optical, and electrical properties of Cu(In, G)$Se_2$ thin films", JOURNAL OF APPLIED PHYSICS 106, 034908_2009
[Non-Patent Document 3] D. Rudmann at al., "Effect of NaF coevaporation on structural properties of Cu(In, Ga)Se2 thin films", Thin Solid Films 431-432(2003)37-40

SUMMARY OF THE INVENTION

Problems to be Solved by the Invention

However, the following problems still remain in the conventional techniques described above.

It has been found by the study of the present inventors that high concentration Na cannot be added when a sputtering target is produced by the producing method disclosed in Patent Document 4.

Firstly, discoloration of a target occurs as the addition amount of Na compound increases. Specifically, the Na compound readily adsorbs moisture in an environment, which results in the frequent occurrence of discoloration or spots on the target surface. Consequently, a solar cell produced by the target exhibits significantly unstable characteristics.

In addition, the addition of a large amount of Na compound causes frequent occurrence of abnormal electrical discharge during sputtering, resulting in a reduction in mechanical strength and degradation in crack resistance. Specifically, the addition of a large amount of a non-conductive Na compound which is hardly sintered and exhibits low mechanical strength leads to a reduction in mechanical strength of a target and an increase in defect occurrence rate during machine processing, resulting in a readily occurrence of abnormal electrical discharge caused by a Na compound during sputtering.

The present invention has been made in view of the aforementioned circumstances, and an object of the present invention is to provide a sputtering target which contains Na in high concentration and, despite this, is inhibited from discoloration, generating spots, and causing abnormal electrical discharge, and which has high strength and rarely breaks and a method for producing the same.

Means for Solving the Problems

The present inventors have studied that 1.0 to 15 at % of Na can be added to a. Cu—Ga alloy sputtering target having 10 to 40 at % of Ga concentration. Consequently, the present inventors have found that the selection of a starting material, an improvement in a producing method, or the like can solve the above problems while adding high concentration Na to a sputtering target.

The present invention is used on the above findings and adopts the following structure in order to solve the aforementioned problems. Specifically, the sputtering target of the present invention is characterized in that the sputtering target has a component composition that contains 10 to 40 at % of Ga and 1.0 to 15 at % of Na as metal element components other than F, S, and Se, with the remainder composed of Cu and unavoidable impurities, wherein the Na is contained in the form of at least one Na compound selected from sodium fluoride, sodium sulfide, and sodium selenide, and the sputtering target has a theoretical density ratio of 90% or higher, a flexural strength of 100 N/mm$^2$ or higher, and a bulk resistivity of 1 mΩ·cm or less, and the number of 0.05 mm$^2$ or larger aggregates of the Na compound present per cm$^2$ area of the target surface is 1 or less on average.

As described above, sufficient assurance of a target density, assurance of a flexural strength and an electrical resistance, and suppression of aggregate formation make possible to realize a sputtering target which contains Na in high concentration and, despite this, is inhibited from discoloration, generating spots, and causing abnormal electrical discharge, and which has high strength and rarely breaks.

It should be noted that, in the present invention, the content of Na and the content of Ga axe relative to the entire metal element components other than F, S and Se in the sputtering target and are calculated as the ratio thereof to the summation of Cu, Ga, and Na atoms in the target as described below.

Na (at %): Na/(Na+Cu+Ga)×100%

Ga (at %): Ga/(Na+Cu+Ga)×100%

The reason why the content of Na contained in the form of a Na compound is set within the above range is as follows. If the content of Na exceeds 15 at %, the mechanical strength of the target significantly reduces or a sufficient sintered density of the target cannot be ensured and abnormal electrical discharge during sputtering increases. On the other hand, if the content of Na is less than 1 at %, the amount of Na in the film is in short, so that the addition of targeted high concentration Na cannot be achieved.

The reason why the theoretical density ratio of the target is set to 90% or higher is because, if the theoretical density ratio is less than 90%, open pores which are present in the target and communicate with external atmosphere increase, and the Na compound contained in the target absorbs moisture from external atmosphere, resulting in a discoloration of the target during manufacturing processing, during storage, and during use.

On the other hand, the target having a high target density and containing a large amount of a Na compound has a greater tendency to increase its brittleness. In contrast, in the present invention, the target has a flexural strength of 100 N/mm$^2$ or higher so as to prevent the occurrence of cracking during machine processing for target production or sputtering.

Furthermore, when a large amount of a non-conductive Na compound is added, abnormal electrical discharge may readily occur during sputtering. In the present invention, the bulk resistivity of the target is set to 1 mΩ·cm or less so as to avoid abnormal electrical discharge.

Furthermore, as a result of the study of the present inventors, it has been found that, when a Na compound is added to the target at high concentration (Na: 1 to 15 at %), 0.05 mm$^2$ or larger aggregate (hereinafter also referred to as "Na compound aggregate") of the Na compound has a large contact area with external atmosphere and thus is readily susceptible to moisture-absorption, resulting in a main cause for occurrence of discoloration and spots on the target surface. Discoloration and spots occurred on the target surface due to 0.05 mm$^2$ or larger aggregates of the Na compound cannot be removed by pre-sputtering performed upon start of use of a normal target, resulting in incorporation of impurities (absorbed H and O) in the deposited film. Furthermore, the emission of adsorbed water from aggregates during sputtering results in local, concentration of plasma which causes the occurrence of significant abnormal electrical discharge around spots generated by aggregates. Then, the Na compound which inherently has a high vapor pressure is evaporated by high temperature caused by abnormal electrical, discharge, which further draws plasma, resulting in formation of abnormal electrical, discharge mark in the form of cavity in proximity to the spots. The surface of the target in which such significant abnormal electrical discharge has occurred is significantly damaged, so that the target cannot be used after the occurrence of one or several abnormal electrical discharges. Such a problem is particularly apparent in the target of the present invention containing high concentrations of a Na compound. In contrast, in the present invention, the occurrence of discoloration and spots is suppressed by restricting the number of 0.05 mm$^2$ or larger aggregates of the Na compound present per cm² area of the target surface to be 1 or less on average, so that incorporation of impurities in the film due to such discoloration and spots, a reduction in mechanical strength of the target, and the occurrence of abnormal, electrical discharge during sputtering can be prevented.

It is preferable that the sputtering target of the present invention has a structure in which a Na compound phase is dispersed in a target material and the average particle diameter of the Na compound phase is 10 μm or less.

Here the average particle diameter is a diameter of a circle equivalent to a projected area.

Since the target containing high concentrations of a Na compound contains a large amount of an insulator Na compound, it is difficult to diffuse the Na compound phase using a normal producing method. As in the above target of the present invention, significant abnormal electrical discharge which may leave a cavity-like discharge mark on the target surface can be prevented by restricting the number of 0.05 mm² or larger aggregates of the Na compound present per cm² area of the target surface to be 1 or less on average. However, if the micro-diffusion of the Na compound phase is not appropriately performed, abnormal electrical discharge called micro arc readily occurs during direct-current sputtering (DC sputtering). Although no significant damage is imparted to the target depending on the degree of micro arc, such micro arc adversely affects on the film quality of the obtained film. The present inventors have found that micro arc abnormal electrical discharge caused by a Na compound can be significantly reduced if the average particle diameter of the Na compound phase is 10 μm or less. It is inevitable to contact the Na compound located on a top surface of the target with external atmosphere. Thus, if the average particle diameter thereof exceeds 10 μm, the amount of moisture absorption increases, which may result in discoloration of the target surface.

In order to overcome these disadvantages, in the sputtering target of the present invention, the grain size of the Na compound phase is optimized as described above so as to enable high-speed deposition under a DC sputtering condition or a pulse DC sputtering condition. Specifically, in the sputtering target of the present invention, the average particle diameter of the respective Na compound phases is set to 10 μm or less, so that discoloration of the target surface can be suppressed to the minimum level and micro arc abnormal electrical discharge caused by the Na compound can be suppressed so as to enable stable DC sputtering or pulse DC sputtering.

It is preferable that the sputtering target of the present invention has a content of oxygen of 200 to 2000 ppm.

Specifically, since the sputtering target has a content of oxygen of 200 to 2000 ppm, the occurrence of NaO having high moisture absorptivity is prevented, so that discoloration and a reduction in mechanical strength can be suppressed.

If oxygen is present in the CuGa target to which a Na compound is added, oxygen gradually reacts with the Na compound, so that NaO having high moisture absorptivity is formed, which leads to the occurrence of discoloration and a reduction in mechanical strength. In particular, the content of oxygen exceeding 2000 ppm is likely to cause the occurrence of discoloration and a reduction in mechanical strength of the target, and thus, the content of oxygen is set to 2000 ppm or less. On the other hand, it is practically very difficult to set the oxygen concentration in the target to be less than 200 ppm, and thus, the lower limit of the oxygen concentration in the target is set to 200 ppm.

It is preferable that, in the sputtering target of the present invention, the average particle diameter of a metal phase in the target material is 20 μm or less.

Since, in the sputtering target, the average particle diameter of a metal phase in the target, material is 20 μm or less, a toughness of the target can be favorably maintained even if the target has a theoretical density ratio of 90% or higher and contains high concentrations of the is compound. Specifically, although the theoretical density ratio of the target needs to be 90% or larger in order to minimize moisture absorption of the target as described above, the target of the present invention containing a large amount of a Na compound tends to increase its brittleness with increasing the target density. Thus, it is effective to set the average crystal particle diameter of a metal phase to be 20 μm or less in order to maintain, the toughness of the target. Note that, if the average particle diameter thereof exceeds 20 μm, defects readily occur during machine processing of the target.

A method for producing the sputtering target of the present invention is characterized in that the method includes a step of sintering a powder mixture of Na compound powder and Cu—Ga powder, wherein the Cu—Ga powder is composed of Cu—Ga alloy powder or Cu—Ga alloy powder and Cu powder, the average particle diameter of the Cu—Ga powder is 1 to 45 μm, and the proportion of the Cu—Ga powder particles having a particle diameter of 30 μm or less is over half of the total powder weight of the Cu—Ga powder.

Since, in the method for producing the sputtering target, the average particle diameter of the Cu—Ga powder is 1 to 45 μm and the proportion of the Cu—Ga powder particles having a particle diameter of 30 μm or less is over half of the total powder weight of the Cu—Ga powder, a sputtering target which contains Na in high concentration and, despite this, is inhibited from discoloration, generating spots, and causing abnormal electrical discharge, and which has high strength and rarely breaks can be produced.

When fine metal powder is mixed with fine Na compound powder upon addition of a large amount of the Na compound, the network of metal powder cannot be formed, which results in a reduction in mechanical strength and a reduction in conductivity of the obtained target. Thus, the average particle diameter of Cu—Ga powder is set to 1 μm or larger.

On the other hand, if the particle diameter of Cu—Ga powder is too large, dispersion of the Na compound becomes insufficient. In addition, large aggregates of the Na compound are formed, which results in discoloration, a reduction in mechanical strength of the target, and the occurrence of abnormal electrical discharge. In the target produced by using Cu—Ga powder having a large particle diameter, the Na compound is readily concentrated on the grain boundary of the metal phase, which also results in discoloration, a reduction in mechanical strength of the target, and the occurrence of abnormal electrical discharge. In contrast, the average particle diameter of the Cu—Ga powder is set to 45 μm or less and the proportion of the Cu—Ga powder particles having a particle diameter of 30 μm or less is over half of the total powder weight of the Cu—Ga powder, so that the Cu—Ga powder falls within an appropriate particle size distribution range, and thus, discoloration, a reduction in mechanical strength of the target, and the occurrence of abnormal electrical discharge can be prevented.

It is preferable that the method for producing the sputtering target of the present invention includes a step of drying the Na compound powder at a temperature of 70° C. or higher prior to making the Na compound powder into the powder mixture.

It is preferable that the method for producing the sputtering target of the present invention includes a step of drying the powder mixture at a temperature of 70° C. or higher.

Since these methods for producing the sputtering target include a step of drying the Na compound powder at a temperature of 70° C. or higher prior to making the Na compound powder into the powder mixture or a step of drying the powder mixture at a temperature of 70° C. or higher, the content of oxygen can be reduced and re-agglomeration after mixture of the starting material powder can be suppressed while maintaining dispersibility of Na compound particles.

The method for producing the sputtering target of the present invention is characterized in that the method includes sintering the powder mixture in a non oxidizing atmosphere or in a vacuum in, the step of sintering the powder mixture.

Specifically, since, in the method for producing the sputtering target, die powder mixture is sintered in a non-oxidizing atmosphere or in a vacuum, the content of oxygen can further be reduced.

Effects of the Invention

According to the present invention, the following effects may be provided.

Specifically, since, in the sputtering target of the present invention and the method for producing the same, Na is contained in the form of the Na compound at high concentration in the above range, the sputtering target has a theoretical density ratio of 90% or higher, a flexural strength of 100 N/mm$^2$ or higher, and a bulk resistivity of 1 mΩ·cm or less, and the number of 0.05 mm$^2$ or larger aggregates of the Na compound present per cm$^2$ area of the target surface is 1 or less on average, the sputtering target contains Na in high concentration and, despite this, is inhibited from discoloration caused by moisture absorption and causing abnormal electrical discharge, has high strength, and rarely breaks. Thus, the sputtering target of the present invention can be employed so as to form a light absorbing layer for a CIGS thin-film solar cell using the sputtering method because high concentration Na can be added to a light absorbing layer with high mass productivity, so that a CIGS thin-film solar cell exhibiting high power generation efficiency can be produced.

BEST MODES FOR CARRYING OUT THE INVENTION

Figure 1:
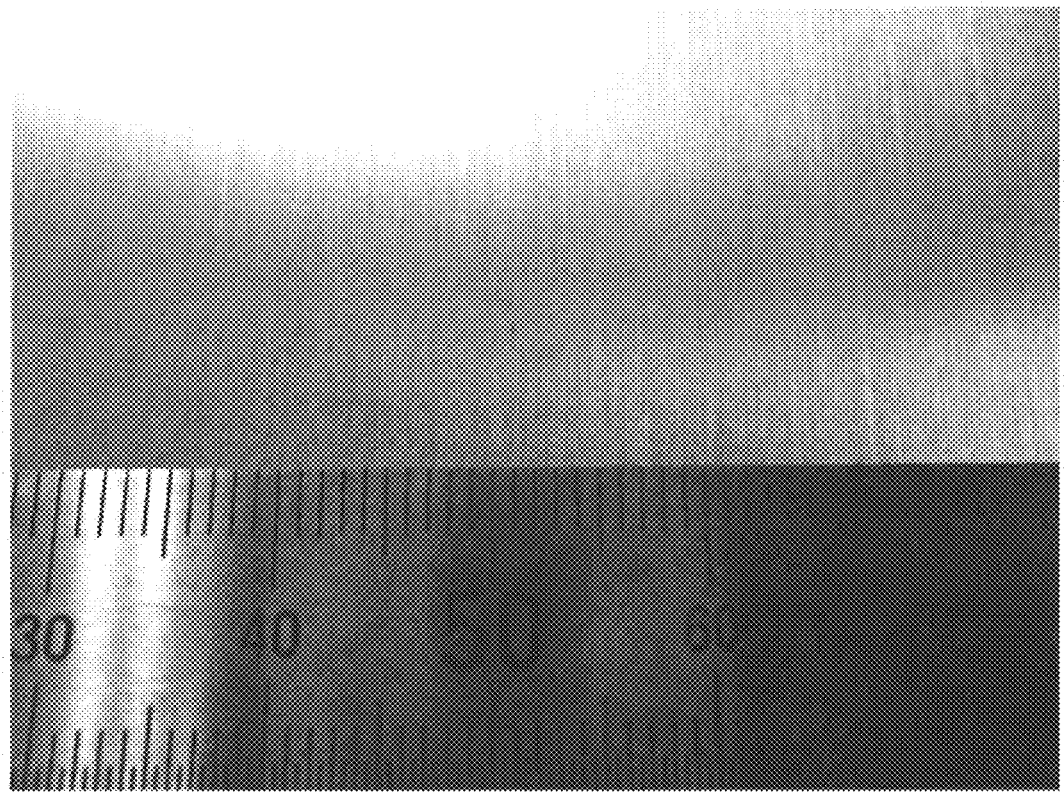
FIG. 1(a) is an optical microscope photograph illustrating the aggregate of a target surface in Example 20 of the present invention.
FIG. 1(b) is an optical microscope photograph illustrating the aggregate of a target surface in Example 21 of the present invention.
Figure 1:
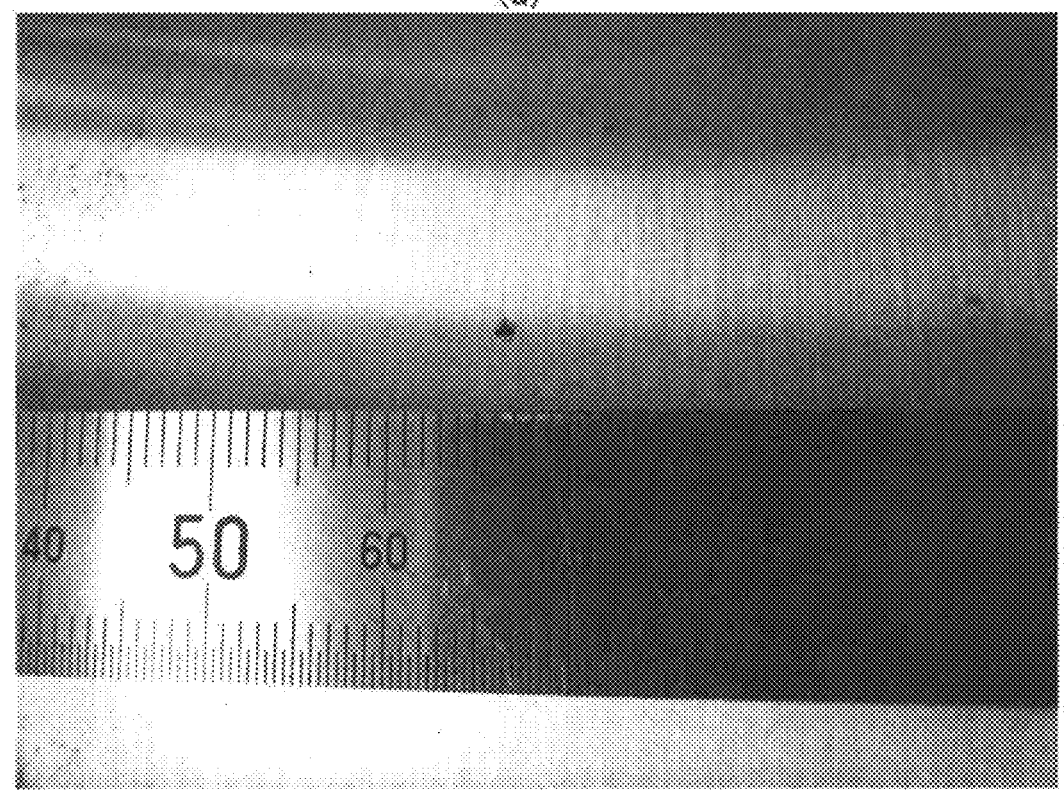

Hereinafter, a description will be given of the sputtering target of the present invention and a method for producing the same according to one embodiment of the present invention.

(Sputtering Target)

The sputtering target of the present embodiment has a component composition that contains 10 to 40 at % of Ga and 1.0 to 15 at % of Na as metal element components other than F, S, and Se, with the remainder composed of Cu and unavoidable impurities, wherein the Na is contained in the form of at least one Na compound selected from sodium fluoride, sodium sulfide, and sodium selenide, a theoretical density ratio of 90% or higher, a flexural strength of 100 N/mm$^2$ or higher, and a bulk resistivity of 1 mΩ·cm or less, and the number of 0.05 mm$^2$ or larger aggregates of the Na compound present per cm$^2$ area of the target surface is 1 or less on average.

It is preferable that the sputtering target of the present embodiment has a structure in which a Na compound phase is dispersed in a target material and the average particle diameter of the Na compound phase is 10 μm or less.

Furthermore, it is preferable that the sputtering target of the present embodiment has a content of oxygen of 200 to 2000 ppm and it is preferable that the average particle diameter of a metal phase in the target material is 20 μm or less.

<Theoretical Density Ratio>

Measurement of the theoretical density ratio of the target is calculated by weight and dimension.

Specifically, since the density (theoretical density) of a pore-free green body varies depending on the actual proportion of Cu/Ga, the type of an input starting material, and a sintering condition, the theoretical density ratio is calculated as follows:

Firstly, a Cu—Ga metal mixture having the same proportion as the Cu/Ga ratio in the target of the present embodiment is melted at a temperature of 1200° C., is casted, and then is slowly cooled down. The density of the resulting defect-free ingot having dimensions of 10 cm×10 cm×10 cm is measured, and the measured density is defined as the theoretical density of a Cu—Ga alloy having the above proportion.

For the Na compounds, the theoretical densities of NaF, Na$_2$S, and Na$_2$Se are 2.79 g/cm$^3$, 1.36 g/cm$^3$, and 2.65 g/cm$^3$, respectively. The theoretical density of the target is calculated by using, the theoretical densities of the Cu—Ga alloy and the Na compound and the contents of Cu, Ca, and the Na compound in the target of the present embodiment.

Thus, the theoretical density ratio is defined as "(target density obtained by weight/dimension)/theoretical density of target×100%".

Flexural Strength>

For the flexural strength, the sintered target is processed according to JIS R1601 so as to measure the bending strength (flexural strength) thereof. Specifically, the target is processed in the form of a rod having a length of 40 mm, a width of 4 mm, and a thickness of 3 mm so as to measure the flexural strength thereof.

<Electrical Resistance>

The electrical resistance of the target is measured by using a four-probe method.

<Aggregate>

For measuring the size of the aggregate, the target surface having an area of 100 cm$^2$ is observed by an optical microscope with a magnification of 10 times, and then its photograph is taken (e.g., see FIG. 1). The size of the aggregate is calculated by the photograph, and the number of 0.05 mm$^2$ or larger aggregates of the Na compound is counted. Furthermore, the fact that the aggregate is the Na compound is confirmed by the SEM-FOX function. The average number of 0.05 mm$^2$ or larger aggregates of the Na compound present per cm$^2$ area of the target surface is calculated within an area of 100 cm$^2$ on the target surface.

<Average Particle Diameter of Na Compound Phase>

Next, in order to measure the average particle diameter of the Na compound phase in the target material, samples for observation are produced as follows so as to calculate their average particle diameters.

Firstly, the sintered sputtering target is cut at any section to thereby produce a block-shaped sample with a size of about 5×10×3 mm. Next, the sample is polished until the surface roughness Ra reaches 0.5 μm or less to thereby produce an observation plane. Furthermore, the observation plane is photographed by an SEM with a magnification of 100 times. After the cross-sectional area of the Na compound phase in the field of view of 1000 μm×1000 μm is calculated in terms of the diameter of a circle equivalent to a projected area, the average particle diameter of particles in the field of view is calculated.

<Average Particle Diameter of Metal Phase>

The method for producing samples for observation for measuring the average particle diameter of the metal phase and the calculation of the average particle diameter thereof are as follows.

Firstly, the observation plane of the block-shaped sample is subject to etching by being immersed into an etching solution (50 ml of pure water, 5 ml of aqueous hydrogen peroxide, and 45 ml of ammonia water) for five seconds.

Next, the alloy structure of the etching surface is photographed by an optical microscope with a magnification of 250 times. At this time, the cross-sectional area of the crystal in the field of view of 500 μm×1000 μm is calculated in terms of the diameter of a circle equivalent to a projected area to thereby calculate the average particle diameter of particles in the field of view.

(Method for Producing Sputtering Target)

Next, a description will be given of a method for producing the sputtering target of the present embodiment.

The method for producing the sputtering target of the present embodiment is characterized in that the method includes a step of sintering a powder mixture of Na compound powder and Cu—Ga powder, wherein the Cu—Ga powder is composed of Cu—Ga alloy powder or Cu—Ga alloy powder and Cu powder, the average particle diameter of the Cu—Ga powder is 1 to 45 μm, and the proportion of the Cu—Ga powder particles having a particle diameter of 30 μm or less is over half of the total powder weight of the Cu—Ga powder. Furthermore, it is preferable that the average radius of the Cu—Ga powder is 10 to 40 μm in order to reduce the content of oxygen in the Cu—Ga alloy powder.

<Na Compound Powder>

Na compound powder has a purity of 3 N or greater and preferably has a primary particle diameter of 0.01 to 1.0 μm in consideration of the suppression of an increase in the content of oxygen and the mixability between Cu—Ga alloy powder and Na compound powder.

In order to reduce the content of oxygen in the target to the level of 2000 ppm or less, it is preferable that adsorbed moisture contained in the Na compound is removed in advance in a dried environment at a temperature of 70° C. before mixing. For example, it is effective to dry the powder mixture in a vacuum drier in a vacuum environment at a temperature of 120° C. for 10 hours.

Furthermore, the Na compound exhibits strong moisture absorptivity and is dissolved into water. Thus, a wet-type mixing and pulverizing device with water is inappropriate for the Na compound.

<Preparation of Powder Mixture>

In order to prepare a powder mixture of Na compound powder and Cu—Ga powder, a pulverizing method and the following different mixing methods (1) to (3) may be employed by using a mixing and pulverizing device (e.g., ball mill, jet mill, Henshell mixer, attritor, or the like).

(1) In the case where pulverization of Na compound powder and mixing of Na compound powder and Cu—Ga powder are separately performed:

It is preferable that the mean secondary particle diameter of the Na compound obtained by pulverization is from 1 μm to 5 μm. It is preferable that the pulverization step is performed in a dried environment at a humidity RH of 40% or less. It is preferable that the Na compound powder obtained after pulverization is dried at a temperature of 70° C. or higher before mixing as described above.

Next, the Na compound powder and the Cu—Ga powder prepared in a target composition are mixed by using a dry-type mixing device in a dried environment with a relative humidity RH of 40% or less to thereby prepare a powder mixture. Note that mixing is more preferably performed in a reducing atmosphere.

(2) In the case where pulverization of Na compound powder and mixing of Na compound powder and Cu—Ga powder are simultaneously performed:

The dried Na compound powder and the Cu—Ga powder prepared in a target composition are simultaneously filled in a mixing and pulverizing device to thereby simultaneously perform mixing and pulverizing of the Na compound powder. Pulverization is ended when the mean secondary particle diameter of the Na compound powder reaches 5 μm or less. Note that mixing is preferably performed in a dried environment with a relative humidity RH of 40% or less and is more preferably performed in a reducing atmosphere.

(3) In the case where a plurality of Cu—Ga alloy powder with different Ga concentrations is used:

Firstly, Cu—Ga alloy powder (hereinafter referred to as "high Ga powder") in which the content of Ga is set to be greater than the proportion of Cu/Ga in the target composition and Cu—Ga alloy powder or Cu powder (hereinafter referred to as "low Ga powder") in which the content of Ga is set to be less than the proportion of Cu/Ga in the target composition are prepared.

The high Ga powder is mixed with the dried Na compound powder and then the low Ga powder is further added to and uniformly mixed with the resulting mixture to thereby produce a powder mixture.

The aforementioned mixing is performed in a low humidity environment as described in (1) and (2). Note that mixing is more preferably performed in a reducing atmosphere.

In any one of (1) to (3), it is preferable that adsorbed moisture contained in the powder mixture is removed after mixing. For example, it is effective to dry the powder mixture in a vacuum drier in a vacuum environment at a temperature of 80° C. for three hours or longer.

Next, the starting material powder mixed by any one of these methods (1) to (3) is encapsulated and stored in a plastic resin pouch in a dried environment with a relative humidity RH of 30% or less. This is for the purpose of preventing moisture absorption due to the presence of the Na compound or aggregation of particles due to moisture absorption from being occurred.

<Sintering Step>

In order to prevent oxidization of Cu—Ga powder during sintering, it is preferable that a sintering step is performed in a non-oxidizing reducing atmosphere, in a vacuum, or in an inert gas atmosphere.

The following three sintering methods are applicable as the method for sintering a powder mixture:

1. The powder mixture is filled in a die, is filled in a forming product or a forming mold molded by cold-pressing, and is subject to tapping to thereby form a formed product having a constant bulk density. Then, the formed product is subject to sintering in a vacuum, in an inert gas atmosphere, or in a reducing atmosphere.
2. The powder mixture is subject to hot pressing in a vacuum or in an inert gas atmosphere.
3. The powder mixture is subject to sintering by the HIP method (hot isostatic pressing).

<Machine Processing or the Like>

Next, the Cu—Ga—Na compound sintered body obtained in the sintering step is processed into a specified shape of a target using regular discharge processing, machining, or grinding processing to thereby produce the sputtering target of the present embodiment. At this time, since the Na compound dissolves with water, a dry-type method without using a coolant or a wet-type method with using a water-free coolant is preferably used upon processing. Also, after processing the surface of a target in advance using a wet-type method, the surface thereof is further subject to precision machining by a dry-type method.

Next, the processed sputtering target is bonded to a backing plate consisting of Cu or SUS (stainless) or other metal (e.g., Mo) using in as a solder, and the resulting target is provided for sputtering.

In order to prevent oxidization and moisture absorption of the processed target from being occurred, the entire target is preferably stored in a vacuum pack or a pack purged with inert gas.

<Use Method of Sputtering Target>

The thus produced sputtering target is subject to DC magnetron sputtering using Ar gas as sputtering gas. At this time, a pulse DC power supply for applying a pulse voltage is preferably used but a non-pulse DC power supply may also be employed for sputtering depending on the content of the Na compound. The input power during sputtering is preferably in the range of from 1 W/cm$^2$ to 10 W/cm$^2$.

Effects in the Present Embodiment

As described, above, since the sputtering target of the present embodiment has a theoretical density ratio of 90% or higher, a flexural strength of 100 N/mm$^2$ or higher, and a bulk resistivity of 1 mΩ·cm or less, and the number of 0.05 mm$^2$ or larger aggregates of the Na compound present per cm$^2$ area of the target surface is 1 or less on average, sufficient assurance of a target density, assurance of a flexural strength and an electrical resistance, and suppression of aggregate formation make possible to realize a sputtering target which contains Na in high concentration and, despite this, is inhibited from discoloration, generating spots, and causing abnormal electrical discharge, and which has high strength and rarely breaks.

The average particle diameter of the Na compound phases is 10 μm or less, whereby abnormal electrical discharge caused by the Na compound may be suppressed and thus stable DC sputtering or pulse DC sputtering becomes possible.

Furthermore, since the sputtering target has a content of oxygen of 200 to 2000 ppm, the occurrence of NaO having high moisture absorptivity is prevented, so that discoloration and a reduction in mechanical strength can be suppressed.

Since the average particle diameter of a metal phase in the target material is 20 μm or less, a toughness of the target can be favorably maintained even if the target has a theoretical density ratio of 90% or higher and contains high concentrations of the Na compound.

Since, in the method for producing the sputtering target of the present embodiment, the average particle diameter of the Cu—Ga powder is 1 to 45 μm and the proportion of the Cu—Ga powder particles having a particle diameter of 30 μm or less is over half of the total powder weight of the Cu—Ga powder, a target in which a reduction in mechanical strength and conductivity and the occurrence of discoloration are suppressed can be produced.

Furthermore, since these methods for producing the sputtering target include a step of drying the Na compound powder at a temperature of 70° C. or higher prior to making the Na compound powder into the powder mixture or a step of drying the powder mixture at a temperature of 70° C. or higher, the content of oxygen can be reduced and re-agglomeration after mixture of the starting material powder can be suppressed while maintaining dispersibility of Na compound particles.

Examples

Next, the sputtering target of the present invention and a method for producing the same will be specifically described with reference to the evaluation result of the actually produced sputtering target by way of Examples, based on the aforementioned embodiment.

Examples

Firstly, Cu—Ga alloy powder having the component composition and the particle diameter shown in Table 1 and Cu powder (purity 4 N) were blended with a NaF compound powder having a purity of 3 N and a primary mean particle diameter of 1 μm so as to achieve the amount thereof as shown in Table 1 to thereby produce a powder mixture in each of Examples 1 to 24. Each of these powder mixtures was firstly dried in a predetermined vacuum environment as described above. Then, the dried starting material powder was placed in a polyethylene pot having a volume of 10 L. Furthermore, a zirconia ball having a diameter of 2 mm dried at a temperature of 80° C. for 10 hours was further added in the pot, and the resulting mixture was mixed in ball mill for a specified time. Mixing was performed in a nitrogen atmosphere. Note that a zirconia ball having a diameter of 2 mm has light weight and is effective for diffusion mixing of Cu powder and Cu—Ga alloy powder without collapsing. The best diffusion effect is obtained when the weight ratio of the ball to the powder is 2:1.

Next, the obtained powder mixture was sieved, was dried in a predetermined environment as described above, and then was sintered under the condition as specified in Table 2.

In the case of ordinary-pressure sintering, the powder mixture was firstly filled in a metal mold, and then pressurized at normal temperatures at a pressure of 1500 kgf/cm$^2$ to thereby form a formed product. The formed product was sintered in a mixed atmosphere of nitrogen and 3% hydrogen to thereby obtain a sintered body having high density.

In the case of hot pressing (HP), the starting material powder was subject to vacuum hot pressing by being filled in a graphite mold. In the case of hot isostatic pressing (HIP), the formed product was produced as in ordinary-pressure sintering, and then was put into a stainless container having a thickness of 0.5 mm, was encapsulated in the plastic resin pouch through vacuum de-aeration, and was subject to HIP processing.

These sintered bodies were subject to dry-type machining to thereby produce targets (Examples 1 to 24) each having a diameter of 125 (mm) and a thickness of 5 (mm).

For comparison, the targets in Comparative Examples 1 to 16 were produced under the condition which was outside the scope of the present invention as shown in Tables 4 and 5.

TABLE 1

| | Cu—Ga(I) | | | Cu—Ga(II) | | | Cu | | |
|---|---|---|---|---|---|---|---|---|---|
| | AVERAGE PARTICLE DIAMETER (μm) | Ga/Ga + Cu (ATOMIC RATIO) | AMOUNT ADDED (g) | AVERAGE PARTICLE DIAMETER (μm) | Ga/Ga + Cu (ATOMIC RATIO) | AMOUNT ADDED (g) | AVERAGE PARTICLE DIAMETER (μm) | AMOUNT ADDED (g) | AVERAGE PARTICLE DIAMETER OF Cu—Ga POWDER |
| EXAMPLE 1 | 28 | 0.40 | 6250 | | | | | | 28 |
| EXAMPLE 2 | 21 | 0.32 | 6259 | | | | | | 21 |
| EXAMPLE 3 | 28 | 0.25 | 6230 | | | | | | 28 |
| EXAMPLE 4 | 45 | 0.50 | 3100 | | | | 1 | 3000 | 23 |
| EXAMPLE 5 | 43 | 0.37 | 4400 | | | | 5 | 1500 | 33 |
| EXAMPLE 6 | 35 | 0.15 | 2900 | 31 | 0.30 | 2900 | | | 33 |
| EXAMPLE 7 | 28 | 0.50 | 2100 | 20 | 0.40 | 3200 | | | 23 |
| EXAMPLE 8 | 30 | 0.30 | 5250 | | | | | | 30 |
| EXAMPLE 9 | 10 | 0.30 | 5250 | | | | | | 10 |
| EXAMPLE 10 | 27 | 0.18 | 3650 | | | | 1 | 1500 | 20 |
| EXAMPLE 11 | 29 | 0.40 | 5000 | | | | | | 29 |
| EXAMPLE 12 | 30 | 0.20 | 4550 | | | | | | 30 |
| EXAMPLE 13 | 22 | 0.40 | 3000 | 45 | 0.20 | 2000 | 1 | 1200 | 25 |
| EXAMPLE 14 | 18 | 0.35 | 6100 | | | | | | 18 |
| EXAMPLE 15 | 18 | 0.25 | 5500 | | | | | | 18 |
| EXAMPLE 16 | 35 | 0.30 | 3500 | | | | 4 | 2000 | 24 |
| EXAMPLE 17 | 28 | 0.40 | 5100 | | | | | | 28 |
| EXAMPLE 18 | 31 | 0.40 | 6350 | | | | | | 31 |
| EXAMPLE 19 | 11 | 0.15 | 4000 | 35 | 0.05 | 1950 | | | 19 |
| EXAMPLE 20 | 21 | 0.30 | 5550 | | | | | | 21 |
| EXAMPLE 21 | 11 | 0.27 | 5000 | | | | 3 | 2000 | 9 |
| EXAMPLE 22 | 26 | 0.40 | 4000 | | | | 1 | 1900 | 18 |
| EXAMPLE 23 | 27 | 0.35 | 5600 | | | | | | 27 |
| EXAMPLE 24 | 28 | 0.37 | 5350 | | | | | | 28 |

| | PERCENTAGE OF PARTICLES HAVING DIAMETER OF 30 μm OR LESS IN Cu—Ga POWDER (wt %) | AMOUNT OF Na COMPOUND POWDER ADDED (g) | | | DRY CONDITION OF Na COMPOUND POWDER PRIOR TO MIXING | MIXING TIME (hour) | DRY COMPOSITION AFTER MIXING |
|---|---|---|---|---|---|---|---|
| | | NaF | Na$_2$S | Na2Se | | | |
| EXAMPLE 1 | 55 | 105 | | | 80° C. 8 HOURS | 3 | 70° C. 8 HOURS |
| EXAMPLE 2 | 80 | 105 | | | 70° C. 4 HOURS | 3 | 100° C. 8 HOURS |
| EXAMPLE 3 | 59 | 105 | | | 80° C. 2 HOURS | 3 | 100° C. 8 HOURS |
| EXAMPLE 4 | 72 | 126 | | | 80° C. 6 HOURS | 4 | 80° C. 16 HOURS |
| EXAMPLE 5 | 57 | 210 | | | 140° C. 3 HOURS | 2 | 80° C. 16 HOURS |
| EXAMPLE 6 | 52 | 210 | | | 80° C. 3 HOURS | 5 | 80° C. 16 HOURS |
| EXAMPLE 7 | 71 | 420 | | | 80° C. 3 HOURS | 5 | 80° C. 16 HOURS |
| EXAMPLE 8 | 62 | 420 | | | 100° C. 8 HOURS | 8 | 70° C. 24 HOURS |
| EXAMPLE 9 | 62 | 420 | | | 80° C. 11 HOURS | 4 | 70° C. 24 HOURS |
| EXAMPLE 10 | 62 | 420 | | | 80° C. 12 HOURS | 3 | 70° C. 24 HOURS |
| EXAMPLE 11 | 58 | 504 | | | 80° C. 5 HOURS | 10 | 70° C. 24 HOURS |
| EXAMPLE 12 | 51 | 630 | | | 120° C. 1 HOURS | 12 | 100° C. 24 HOURS |
| EXAMPLE 13 | 60 | | 117 | | 80° C. 15 HOURS | 4 | 100° C. 8 HOURS |
| EXAMPLE 14 | 81 | | 195 | | 80° C. 10 HOURS | 8 | 100° C. 8 HOURS |
| EXAMPLE 15 | 80 | | 390 | | 80° C. 7 HOURS | 8 | 100° C. 8 HOURS |
| EXAMPLE 16 | 63 | | 390 | | 60° C. 5 HOURS | 10 | 80° C. 16 HOURS |
| EXAMPLE 17 | 60 | | 585 | | 100° C. 4 HOURS | 10 | 100° C. 16 HOURS |
| EXAMPLE 18 | 50 | | | 156 | 90° C. 20 HOURS | 5 | 70° C. 16 HOURS |
| EXAMPLE 19 | 85 | | | 312 | 80° C. 20 HOURS | 5 | 80° C. 16 HOURS |
| EXAMPLE 20 | 79 | | | 625 | 70° C. 22 HOURS | 9 | 100° C. 24 HOURS |

TABLE 1-continued

| | | | | | | | |
|---|---|---|---|---|---|---|---|
| EXAMPLE 21 | 86 | | | 937 | 100° C. 10 HOURS | 18 | 100° C. 24 HOURS |
| EXAMPLE 22 | 62 | 168 | 20 | 31 | 80° C. 24 HOURS | 9 | 70° C. 24 HOURS |
| EXAMPLE 23 | 58 | 84 | 195 | 125 | 100° C. 5 HOURS | 9 | 100° C. 24 HOURS |
| EXAMPLE 24 | 54 | 336 | 39 | 62 | 70° C. 26 HOURS | 8 | 80° C. 24 HOURS |

TABLE 2

| | SINTERING CONDITION | | | SINTERED BODY | | | | THEO- |
|---|---|---|---|---|---|---|---|---|
| | | TEMPER-ATURE | PRESSURE | KEEP TIME | COMPOSITION (at %) | | | OXYGEN CONTENT | RETICAL DENSITY |
| | SINTERING METHOD | (° C.) | (kgf/cm²) | (hour) | Na | Ga | Cu | (wt ppm) | RATIO (%) |
| EXAMPLE 1 | HP | 500 | 500 | 2.0 | 2.6 | 40 | REMAINING | 348 | 92 |
| EXAMPLE 2 | HIP | 700 | 1500 | 1.0 | 2.6 | 31 | REMAINING | 405 | 88 |
| EXAMPLE 3 | ORDINARY-PRESSURE SINTERING | 750 | | 2.0 | 2.6 | 26 | REMAINING | 378 | 97 |
| EXAMPLE 4 | HP | 800 | 100 | 2.0 | 3.1 | 27 | REMAINING | 571 | 97 |
| EXAMPLE 5 | ORDINARY-PRESSURE SINTERING | 750 | | 3.0 | 5.3 | 27 | REMAINING | 489 | 96 |
| EXAMPLE 6 | HP | 800 | 250 | 1.0 | 5.3 | 21 | REMAINING | 781 | 96 |
| EXAMPLE 7 | HP | 500 | 500 | 1.0 | 11.1 | 40 | REMAINING | 891 | 93 |
| EXAMPLE 8 | HIP | 700 | 1000 | 1.0 | 11.1 | 28 | REMAINING | 1148 | 94 |
| EXAMPLE 9 | HP | 700 | 400 | 2.0 | 11.1 | 28 | REMAINING | 867 | 93 |
| EXAMPLE 10 | HIP | 800 | 1000 | 1.0 | 11.1 | 11 | REMAINING | 1350 | 92 |
| EXAMPLE 11 | HP | 600 | 300 | 1.5 | 13.6 | 35 | REMAINING | 1245 | 92 |
| EXAMPLE 12 | HP | 800 | 150 | 2.5 | 14.6 | 18 | REMAINING | 1138 | 94 |
| EXAMPLE 13 | HP | 750 | 250 | 3.5 | 3.0 | 25 | REMAINING | 841 | 98 |
| EXAMPLE 14 | HP | 650 | 500 | 1.0 | 5.1 | 33 | REMAINING | 542 | 98 |
| EXAMPLE 15 | HIP | 750 | 1500 | 1.0 | 10.5 | 21 | REMAINING | 1147 | 94 |
| EXAMPLE 16 | HP | 800 | 500 | 1.5 | 10.5 | 16 | REMAINING | 1824 | 93 |
| EXAMPLE 17 | HIP | 700 | 900 | 2.5 | 14.2 | 32 | REMAINING | 1482 | 91 |
| EXAMPLE 18 | HP | 500 | 350 | 5.0 | 2.5 | 39 | REMAINING | 453 | 93 |
| EXAMPLE 19 | HP | 800 | 500 | 5.0 | 5.1 | 10 | REMAINING | 752 | 95 |
| EXAMPLE 20 | HP | 750 | 450 | 2.0 | 10.5 | 26 | REMAINING | 1161 | 93 |
| EXAMPLE 21 | HIP | 750 | 1500 | 2.0 | 14.7 | 16 | REMAINING | 1973 | 91 |
| EXAMPLE 22 | HP | 700 | 250 | 2.0 | 5.2 | 26 | REMAINING | 1466 | 96 |
| EXAMPLE 23 | HIP | 700 | 1500 | 1.0 | 9.5 | 32 | REMAINING | 892 | 96 |
| EXAMPLE 24 | HP | 600 | 190 | 2.0 | 11.0 | 33 | REMAINING | 1023 | 93 |

| | FLEXURAL STRENGTH (N/mm²) | BULK RESISTIVITY (mΩ · cm) | AVERAGE PARTICLE DIAMETER OF Na COMPOUND PHASE (μm) | AVERAGE NUMBER OF AGGREGATES OF Na COMPOUND PHASE *1 | AVERAGE CRYSTAL PARTICLE DIAMETER OF METAL PHASE (μm) | OCCURRENCE OF SPOTS AND COLOR IRREGU-LARITIES *2 |
|---|---|---|---|---|---|---|
| EXAMPLE 1 | 285 | <0.1 | 2.5 | <0.1 | 6 | NONE |
| EXAMPLE 2 | 360 | <0.1 | 2.6 | <0.1 | 5 | NONE |
| EXAMPLE 3 | 264 | <0.1 | 2.5 | <0.1 | 30 | NONE |
| EXAMPLE 4 | 398 | <0.1 | 2.1 | <0.1 | 11 | NONE |
| EXAMPLE 5 | 387 | <0.1 | 8.0 | 0.1 | 19 | NONE |
| EXAMPLE 6 | 486 | <0.1 | 3.1 | <0.1 | 9 | NONE |
| EXAMPLE 7 | 152 | 0.1 | 3.1 | <0.1 | 8 | NONE |
| EXAMPLE 8 | 321 | 0.1 | 2.9 | <0.1 | 7 | NONE |
| EXAMPLE 9 | 289 | 0.1 | 3.2 | <0.1 | 8 | NONE |
| EXAMPLE 10 | 472 | 0.1 | 4.3 | 0.2 | 5 | NONE |
| EXAMPLE 11 | 167 | 0.2 | 3.6 | 0.3 | 12 | NONE |
| EXAMPLE 12 | 256 | 0.5 | 11.0 | 0.5 | 13 | NONE |
| EXAMPLE 13 | 532 | <0.1 | 2.6 | <0.1 | 12 | NONE |
| EXAMPLE 14 | 321 | <0.1 | 2.1 | <0.1 | 15 | NONE |
| EXAMPLE 15 | 362 | 0.1 | 3.8 | 0.3 | 11 | NONE |
| EXAMPLE 16 | 236 | 0.1 | 3.4 | <0.1 | 8 | NONE |
| EXAMPLE 17 | 130 | 0.4 | 12.0 | 0.6 | 8 | NONE |
| EXAMPLE 18 | 118 | <0.1 | 3.4 | 0.1 | 14 | NONE |
| EXAMPLE 19 | 567 | <0.1 | 3.1 | <0.1 | 15 | NONE |
| EXAMPLE 20 | 265 | 0.2 | 11.0 | 0.5 | 13 | NONE |
| EXAMPLE 21 | 116 | 0.6 | 13.0 | 0.9 | 9 | NONE |
| EXAMPLE 22 | 401 | <0.1 | 3.2 | <0.1 | 8 | NONE |
| EXAMPLE 23 | 180 | 0.1 | 3.4 | 0.1 | 7 | NONE |
| EXAMPLE 24 | 191 | 0.3 | 3.6 | 0.1 | 18 | NONE |

*1 NUMBER OF 0.05 mm² OR LARGES AGGREGATES OF Na COMPOUND PRESENT PER cm² AREA OF TARGET SURFACE. AVERAGE VALUE THEREOF WAS CALCULATED BY MEASURING TARGET SURFACE HAVING AREA OF 100 cm².
*2 VISUALLY CHECKED AREA BEING LEFT TO STAND IN ATMOSPHERE (25° C. AND HUMIDITY OF 60%) FOR 8 HOURS

TABLE 3

| | CRACKING OR CHIPPING DURING CUTTING | CONTINUOUS DISCHARGE TIME (MIN) | TARGET SURFACE STATE AFTER CONTINUOUS DISCHARGE | NUMBER OF TIMES THAT ABNORMAL DISCHARGE OCCURRED DURING SPUTTERING *MICRO ARC | NUMBER OF TIMES THAT ABNORMAL DISCHARGE OCCURRED DURING SPUTTERING *SIGNIFICANT ABNORMAL DISCHARGE | FILM COMPOSITION (at %) | | |
|---|---|---|---|---|---|---|---|---|
| | | | | | | Na | Ga | Cu |
| EXAMPLE 1 | NO | 10 | GOOD | 6 | 0 | 2.0 | 41 | REMAINING |
| EXAMPLE 2 | NO | 10 | GOOD | 9 | 0 | 2.0 | 29 | REMAINING |
| EXAMPLE 3 | NO | 10 | GOOD | 5 | 0 | 2.1 | 25 | REMAINING |
| EXAMPLE 4 | NO | 10 | GOOD | 0 | 0 | 2.7 | 27 | REMAINING |
| EXAMPLE 5 | NO | 10 | GOOD | 58 | 0 | 4.3 | 27 | REMAINING |
| EXAMPLE 6 | NO | 10 | GOOD | 0 | 0 | 4.2 | 20 | REMAINING |
| EXAMPLE 7 | NO | 10 | GOOD | 5 | 0 | 8.2 | 39 | REMAINING |
| EXAMPLE 8 | NO | 10 | GOOD | 4 | 0 | 9.1 | 25 | REMAINING |
| EXAMPLE 9 | NO | 10 | GOOD | 16 | 0 | 8.9 | 26 | REMAINING |
| EXAMPLE 10 | NO | 10 | GOOD | 84 | 0 | 8.8 | 10 | REMAINING |
| EXAMPLE 11 | NO | 10 | GOOD | 88 | 0 | 11.2 | 34 | REMAINING |
| EXAMPLE 12 | NO | 10 | GOOD | 198 | 0 | 11.8 | 20 | REMAINING |
| EXAMPLE 13 | NO | 10 | GOOD | 0 | 0 | 2.1 | 25 | REMAINING |
| EXAMPLE 14 | NO | 10 | GOOD | 2 | 0 | 3.9 | 33 | REMAINING |
| EXAMPLE 15 | NO | 10 | GOOD | 79 | 0 | 7.6 | 22 | REMAINING |
| EXAMPLE 16 | NO | 10 | GOOD | 289 | 0 | 8.2 | 18 | REMAINING |
| EXAMPLE 17 | NO | 10 | GOOD | 197 | 0 | 11.1 | 30 | REMAINING |
| EXAMPLE 18 | NO | 10 | GOOD | 51 | 0 | 2.0 | 40 | REMAINING |
| EXAMPLE 19 | NO | 10 | GOOD | 3 | 0 | 4.1 | 11 | REMAINING |
| EXAMPLE 20 | NO | 10 | GOOD | 181 | 0 | 6.9 | 24 | REMAINING |
| EXAMPLE 21 | NO | 10 | GOOD | 321 | 0 | 10.2 | 15 | REMAINING |
| EXAMPLE 22 | NO | 10 | GOOD | 0 | 0 | 3.8 | 26 | REMAINING |
| EXAMPLE 23 | NO | 10 | GOOD | 26 | 0 | 7.1 | 31 | REMAINING |
| EXAMPLE 24 | NO | 10 | GOOD | 41 | 0 | 6.4 | 30 | REMAINING |

*DURING CONTINUOUS DISCHARGE FOR 10 MINS WITH INPUT POWER OF 8 W/cm$^2$ BY PULSE DC

TABLE 4

| | Cu—Ga(I) | | | Cu—Ga(II) | | | Cu | | AVERAGE |
|---|---|---|---|---|---|---|---|---|---|
| | AVERAGE PARTICLE DIAMETER (μm) | Ga/Ga + Cu (ATOMIC RATIO) | AMOUNT ADDED (g) | AVERAGE PARTICLE DIAMETER (μm) | Ga/Ga + Cu (ATOMIC RATIO) | AMOUNT ADDED (g) | AVERAGE PARTICLE DIAMETER (μm) | AMOUNT ADDED (g) | PARTICLE DIAMETER OF Cu—Ga POWDER |
| COMPARATIVE EXAMPLE 1 | 50 | 0.4 | 6250 | | | | | | 50 |
| COMPARATIVE EXAMPLE 2 | 100 | 0.32 | 6250 | | | | | | 100 |
| COMPARATIVE EXAMPLE 3 | 75 | 0.25 | 6250 | | | | | | 75 |
| COMPARATIVE EXAMPLE 4 | 42 | 0.15 | 2900 | 45 | 0.3 | 2900 | | | 43 |
| COMPARATIVE EXAMPLE 5 | 93 | 0.5 | 2100 | 45 | 0.4 | 3200 | | | 64 |
| COMPARATIVE EXAMPLE 6 | 85 | 0.3 | 5250 | | | | | | 85 |
| COMPARATIVE EXAMPLE 7 | 0.3 | 0.4 | 5000 | | | | | | 0.3 |
| COMPARATIVE EXAMPLE 8 | 67 | 0.2 | 4550 | | | | | | 67 |
| COMPARATIVE EXAMPLE 9 | 72 | 0.4 | 3000 | 45 | 0.2 | 2000 | 10 | 1200 | 52 |
| COMPARATIVE EXAMPLE 10 | 0.8 | 0.25 | 5500 | | | | 4 | 2000 | 0.8 |
| COMPARATIVE EXAMPLE 11 | 106 | 0.3 | 3500 | | | | | | 71 |
| COMPARATIVE EXAMPLE 12 | 65 | 0.4 | 5100 | | | | | | 65 |
| COMPARATIVE EXAMPLE 13 | 49 | 0.4 | 6350 | | | | | | 49 |
| COMPARATIVE EXAMPLE 14 | 93 | 0.3 | 5550 | | | | | | 93 |

TABLE 4-continued

| | | | | | | | | |
|---|---|---|---|---|---|---|---|---|
| COMPARATIVE EXAMPLE 15 | 102 | 0.27 | 5000 | | | 30 | 2000 | 107 |
| COMPARATIVE EXAMPLE 16 | 102 | 0.4 | 4000 | | | 1 | 1900 | 77 |

| | PERCENTAGE OF PARTICLES HAVING DIAMETER OF 30 μm OR LESS IN Cu—Ga POWDER (wt %) | AMOUNT OF Na COMPOUND POWDER ADDED (g) | | | DRY CONDITION OF Na COMPOUND POWDER PRIOR TO MIXING | MIXING TIME (hour) | DRY COMPOSITION AFTER MIXING |
|---|---|---|---|---|---|---|---|
| | | NaF | $Na_2S$ | $Na_2Se$ | | | |
| COMPARATIVE EXAMPLE 1 | 43% | 105 | | | NONE | 3 | NONE |
| COMPARATIVE EXAMPLE 2 | 20% | 105 | | | 70° C. 4 HOURS | 3 | NONE |
| COMPARATIVE EXAMPLE 3 | 41% | 105 | | | NONE | 1 | NONE |
| COMPARATIVE EXAMPLE 4 | 45% | 210 | | | 80° C. 3 HOURS | 5 | NONE |
| COMPARATIVE EXAMPLE 5 | 28% | 420 | | | NONE | 5 | 80° C. 16 HOURS |
| COMPARATIVE EXAMPLE 6 | 38% | 420 | | | 60° C. 8 HOURS | 3 | 50° C. 24 HOURS |
| COMPARATIVE EXAMPLE 7 | 100% | 630 | | | NONE | 1 | NONE |
| COMPARATIVE EXAMPLE 8 | 42% | 840 | | | 40° C. 1 HOUR | 1 | 40° C. 24 HOURS |
| COMPARATIVE EXAMPLE 9 | 38% | | 117 | | 80° C. 15 HOURS | 4 | NONE |
| COMPARATIVE EXAMPLE 10 | 100% | | 350 | | NONE | 8 | NONE |
| COMPARATIVE EXAMPLE 11 | 21% | | 390 | | 70° C. 18 HOURS | 3 | NONE |
| COMPARATIVE EXAMPLE 12 | 39% | | 781 | | NONE | 10 | 60° C. 3 HOURS |
| COMPARATIVE EXAMPLE 13 | 41% | | | 156 | 90° C. 20 HOURS | 5 | 70° C. 16 HOURS |
| COMPARATIVE EXAMPLE 14 | 31% | | | 625 | NONE | 9 | NONE |
| COMPARATIVE EXAMPLE 15 | 22% | | | 1124 | 100° C. 10 HOURS | 3 | 100° C. 24 HOURS |
| COMPARATIVE EXAMPLE 16 | 39% | 168 | 20 | 31 | NONE | 9 | 70° C. 24 HOURS |

TABLE 5

| | SINTERING METHOD | SINTERING CONDITION | | | SINTERED BODY COMPOSITION (at %) | | | OXYGEN CONTENT (wt ppm) | THEORETICAL DENSITY RATIO OF SINTERED BODY (%) |
|---|---|---|---|---|---|---|---|---|---|
| | | TEMPERATURE (° C.) | PRESSURE (kgf/cm²) | KEEP TIME (hour) | Na | Ga | Cu | | |
| COMPARATIVE EXAMPLE 1 | HP | 500 | 80 | 2.00 | 2.3 | 40 | REMAINING | 697 | 78 |
| COMPARATIVE EXAMPLE 2 | HIP | 700 | 1500 | 1.00 | 2.3 | 32 | REMAINING | 754 | 94 |
| COMPARATIVE EXAMPLE 3 | ORDINARY-PRESSURE SINTERING | 840 | | 20.00 | 2.5 | 26 | REMAINING | 243 | 95 |
| COMPARATIVE EXAMPLE 4 | HP | 650 | 250 | 1.00 | 5.0 | 20 | REMAINING | 899 | 76 |
| COMPARATIVE EXAMPLE 5 | HP | 500 | 200 | 1.00 | 10.1 | 39 | REMAINING | 873 | 85 |
| COMPARATIVE EXAMPLE 6 | HIP | 700 | 1000 | 1.00 | 10.1 | 28 | REMAINING | 2369 | 94 |
| COMPARATIVE EXAMPLE 7 | HP | 600 | 300 | 1.50 | 17.0 | 33 | REMAINING | 2132 | 79 |
| COMPARATIVE EXAMPLE 8 | HP | 800 | 150 | 2.50 | 25.4 | 20 | REMAINING | 3520 | 90 |

TABLE 5-continued

| | | | | | | | | | |
|---|---|---|---|---|---|---|---|---|---|
| COMPARATIVE EXAMPLE 9 | HP | 550 | 250 | 3.50 | 3.1 | 26 | REMAINING | 890 | 84 |
| COMPARATIVE EXAMPLE 10 | HIP | 750 | 1500 | 1.00 | 10.9 | 20 | REMAINING | 2389 | 90 |
| COMPARATIVE EXAMPLE 11 | HP | 800 | 500 | 10.00 | 15.4 | 15 | REMAINING | 1543 | 95 |
| COMPARATIVE EXAMPLE 12 | HIP | 700 | 900 | 2.50 | 20.5 | 34 | REMAINING | 3106 | 92 |
| COMPARATIVE EXAMPLE 13 | HP | 500 | 150 | 5.00 | 2.5 | 39 | REMAINING | 382 | 83 |
| COMPARATIVE EXAMPLE 14 | HP | 750 | 450 | 2.00 | 10.0 | 27 | REMAINING | 2084 | 92 |
| COMPARATIVE EXAMPLE 15 | HIP | 750 | 1500 | 2.00 | 20.3 | 15 | REMAINING | 2096 | 88 |
| COMPARATIVE EXAMPLE 16 | HP | 700 | 250 | 2.00 | 5.4 | 25 | REMAINING | 1612 | 93 |

| | FLEXURAL STRENGTH (N/mm$^2$) | BULK RESISTIVITY (mΩ · cm) | AVERAGE PARTICLE DIAMETER OF Na COMPOUND PHASE (μm) | AVERAGE NUMBER OF AGGREGATES OF Na COMPOUND *1 | AVERAGE CRYSTAL PARTICLE DIAMETER OF METAL PHASE (μm) | OCCURRENCE OF SPOTS AND COLOR IRREGULARITIES *2 |
|---|---|---|---|---|---|---|
| COMPARATIVE EXAMPLE 1 | 83 | <0.1 | 6.7 | 2.2 | 4 | YES |
| COMPARATIVE EXAMPLE 2 | 304 | <0.1 | 5.9 | 1.2 | 4 | YES |
| COMPARATIVE EXAMPLE 3 | 98 | <0.1 | 13.0 | 2.3 | 24 | YES |
| COMPARATIVE EXAMPLE 4 | 88 | <0.1 | 4.6 | 1.2 | 2 | YES |
| COMPARATIVE EXAMPLE 5 | 95 | 0.1 | 5.9 | 2.1 | 6 | YES |
| COMPARATIVE EXAMPLE 6 | 289 | 0.1 | 4.2 | 1.1 | 7 | YES |
| COMPARATIVE EXAMPLE 7 | 79 | 0.2 | 12.0 | 2 | 1 | YES |
| COMPARATIVE EXAMPLE 8 | 103 | 0.5 | 19.0 | 4.1 | 13 | YES |
| COMPARATIVE EXAMPLE 9 | 92 | <0.1 | 2.6 | 1.1 | 5 | YES |
| COMPARATIVE EXAMPLE 10 | 89 | 0.1 | 3.8 | 1.1 | 4 | YES |
| COMPARATIVE EXAMPLE 11 | 140 | 0.1 | 4.8 | 1.6 | 27 | YES |
| COMPARATIVE EXAMPLE 12 | 81 | 0.4 | 6.3 | 3.9 | 9 | YES |
| COMPARATIVE EXAMPLE 13 | 211 | <0.1 | 5.4 | 0.1 | 10 | YES |
| COMPARATIVE EXAMPLE 14 | 95 | 0.2 | 3.6 | 1.2 | 12 | YES |
| COMPARATIVE EXAMPLE 15 | 69 | 0.6 | 4.8 | 1.6 | 16 | YES |
| COMPARATIVE EXAMPLE 16 | 132 | <0.1 | 4.8 | 1.4 | 7 | YES |

*1 NUMBER OF 0.05 mm2 OR LARGER AGGREGATES OF Na COMPOUND PRESENT PER cm2 AREA OF TARGET SURFACE. AVERAGE VALUE THEREOF WAS CALCULATED BY MEASURING TARGET SURFACE HAVING AREA OF 100 cm2.
*2 VISUALLY CHECKED AFTER BEING LEFT TO STAND IN ATMOSPHERE (25 OC AND HUMIDITY OF 60%) for 8 HOURS

TABLE 6

| | CRACKING OR CHIPPING DURING CUTTING | CONTINUOUS DISCHARGE TIME (MIN) | TARGET SURFACE STATE AFTER CONTINUOUS DISCHARGE | NUMBER OF TIMES THAT ABNORMAL DISCHARGE OCCURRED DURING SPUTTERING *MICRO ARC | NUMBER OF TIMES THAT ABNORMAL DISCHARGE OCCURRED DURING SPUTTERING *SIGNIFICANT ABNORMAL DISCHARGE | FILM COMPOSITION (at %) Na | Ga | Cu |
|---|---|---|---|---|---|---|---|---|
| COMPARATIVE EXAMPLE 1 | YES | 2 | SIGNIFICANT DISCHARGE MARK | 1968 | 2 | 2.0 | 40 | REMAINING |

TABLE 6-continued

| | CRACKING OR CHIPPING DURING CUTTING | CONTINUOUS DISCHARGE TIME (MIN) | TARGET SURFACE STATE AFTER CONTINUOUS DISCHARGE | NUMBER OF TIMES THAT ABNORMAL DISCHARGE OCCURRED DURING SPUTTERING *MICRO ARC | NUMBER OF TIMES THAT ABNORMAL DISCHARGE OCCURRED DURING SPUTTERING *SIGNIFICANT ABNORMAL DISCHARGE | FILM COMPOSITION (at %) Na | Ga | Cu |
|---|---|---|---|---|---|---|---|---|
| COMPARATIVE EXAMPLE 2 | NO | 3 | SIGNIFICANT DISCHARGE MARK | 1642 | 2 | 1.9 | 28 | REMAINING |
| COMPARATIVE EXAMPLE 3 | YES | 2 | SIGNIFICANT DISCHARGE MARK | 1995 | 1 | 2.1 | 24 | REMAINING |
| COMPARATIVE EXAMPLE 4 | YES | 7 | SIGNIFICANT DISCHARGE MARK | 502 | 1 | 4.0 | 21 | REMAINING |
| COMPARATIVE EXAMPLE 5 | YES | 1 | SIGNIFICANT DISCHARGE MARK | 2011 | 3 | 7.6 | 40 | REMAINING |
| COMPARATIVE EXAMPLE 6 | NO | 5 | SIGNIFICANT DISCHARGE MARK | 539 | 1 | 7.9 | 28 | REMAINING |
| COMPARATIVE EXAMPLE 7 | YES | 3 | SIGNIFICANT DISCHARGE MARK | 3641 | 5 | 12.3 | 34 | REMAINING |
| COMPARATIVE EXAMPLE 8 | YES | 1 | SIGNIFICANT DISCHARGE MARK | 50384 | 6 | 18.3 | 21 | REMAINING |
| COMPARATIVE EXAMPLE 9 | NO | 8 | SIGNIFICANT DISCHARGE MARK | 566 | 1 | 2.0 | 25 | REMAINING |
| COMPARATIVE EXAMPLE 10 | NO | 8 | SIGNIFICANT DISCHARGE MARK | 593 | 1 | 7.2 | 21 | REMAINING |
| COMPARATIVE EXAMPLE 11 | NO | 7 | SIGNIFICANT DISCHARGE MARK | 867 | 1 | 10.7 | 16 | REMAINING |
| COMPARATIVE EXAMPLE 12 | YES | 2 | SIGNIFICANT DISCHARGE MARK | 3820 | 4 | 16.0 | 32 | REMAINING |
| COMPARATIVE EXAMPLE 13 | NO | 10 | SMALL DISCHARGE MARK | 512 | 0 | 2.0 | 39 | REMAINING |
| COMPARATIVE EXAMPLE 14 | YES | 4 | SIGNIFICANT DISCHARGE MARK | 832 | 2 | 8.1 | 26 | REMAINING |
| COMPARATIVE EXAMPLE 15 | YES | 3 | SIGNIFICANT DISCHARGE MARK | 960 | 1 | 14.9 | 15 | REMAINING |
| COMPARATIVE EXAMPLE 16 | NO | 4 | SIGNIFICANT DISCHARGE MARK | 986 | 4 | 4.4 | 25 | REMAINING |

*TIME UNTIL SPUTTERING IS INTERRUPTED DUE TO OCCURRENCE OF SIGNIFICANT ABNORMAL DISCHARGE DURING CONTINUOUS DISCHARGE WITH INPUT POWER OF 8 W/cm2 BY PULSE DC. IN COMPARATIVE EXAMPLE 13, NUMBER OF TIMES THAT ABNORMAL DISCHARGE OCCURRED DURING CONTINUOUS DISCHARGE FOR 10 MINS

EVALUATION

In Examples 1 to 24 of the present invention, the presence/absence of chipping in the targets during machining was recorded and the oxygen concentration for a piece of each of the sintered bodies for analysis was further analyzed by a non-dispersion infrared absorption method. The theoretical, density ratio of each sintered body was calculated by the above method. The flexural strength thereof was performed by a three point bend test at a deformation speed of 0.5 mm/min accordance with JIS R1601. Furthermore, the processed target surface having an area of 100 cm² was observed, the number of 0.05 mm² or larger aggregates of the Na compound was measured, and the average value thereof present per cm² area of the target surface was calculated. The average particle diameter of the Na compound phase and the average particle diameter of the metal phase were measured by the above method. Also, quantitative analysis for the content of Ga and the content of Na in the produced target was carried out using an ICP method (high frequency induction coupled plasma method). Furthermore, the target was left to stand at a temperature of 25° C. at a humidity of 60% for 8 hours, and discoloration of the target surface was visually checked.

Furthermore, the target was set to a magnetron sputtering device and input power of 8 W/cm² was applied to the target by pulse DC sputtering, so that the target film having the thickness of 1000 nm was deposited on a silicon substrate with oxidized coating. The Ar pressure during sputtering was 1.3 Pa and the distance between the target and the substrate was 70 mm. Note that the substrate heating during deposition was not performed. Furthermore, the number of times that micro arc abnormal electrical discharge occurred during continuous sputtering for ten minutes under the aforementioned conditions was automatically recorded using an arcing counter attached to a sputtering power supply. The number of times that significant abnormal electrical discharge occurred was visually checked. In Comparative Examples, significant abnormal electrical discharge occurs, resulting in occurrence of a phenomenon that plasma is vanished or sputtering cannot be performed. Thus, a continuous sputtering time was defined as a time taken until plasma is vanished or sputtering is stopped. The target surface subjected to sputtering was checked as to whether or not significant abnormal electrical discharge markings such as melting, cavity, chipping, or the like are present thereon.

The formed film was peeled off from the substrate to thereby perform quantitative measurement of Na and Ga using the ICE method.

These evaluation results in Examples and Comparative Examples are shown in Tables 2, 3, 5, and 6.

As can be seen from these evaluation results, spots or color irregularities did not occur so that no surface discoloration was observed in Examples as shown in Table 2, whereas spots and color irregularities occurred in Comparative Examples as shown in Table 5.

Cracking and chipping during machining did not occur in all of the Examples as shown in Table 3, whereas cracking or chipping occurred during machining in Comparative Examples 1, 3, 4, 5, 7, 8, 12, 14, and 15 as shown in Table 6. In Comparative Example 3, chipping occurred due to an increase in crystal grains of the metal phase.

Furthermore, the number of times that micro arc abnormal electrical discharge occurred during sputtering was less than 300 in Examples as shown in Table 3, whereas the number of times that micro arc abnormal electrical discharge occurred during sputtering exceeded 500 in Comparative Examples.

Furthermore, the number of times that significant abnormal electrical discharge occurred during sputtering was 0 in Examples as shown in Table 3, whereas the number of times that significant abnormal electrical discharge occurred during sputtering was 1 or more in Comparative Examples except for Comparative Example 13.

Figure 2:
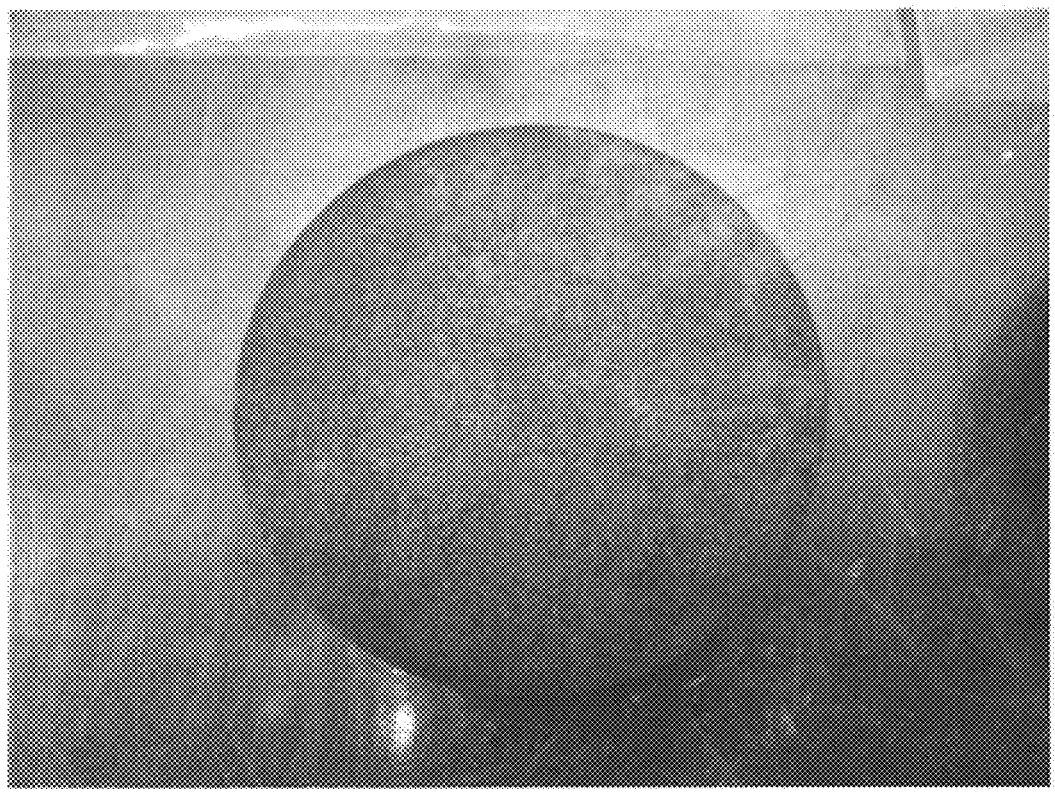
FIG. 2(a) is a photograph illustrating a target surface in Comparative Example 16 in surface discoloration evaluation.
FIG. 2(b) is a photograph illustrating a target surface in Example 6 in surface discoloration evaluation.
Figure 2:
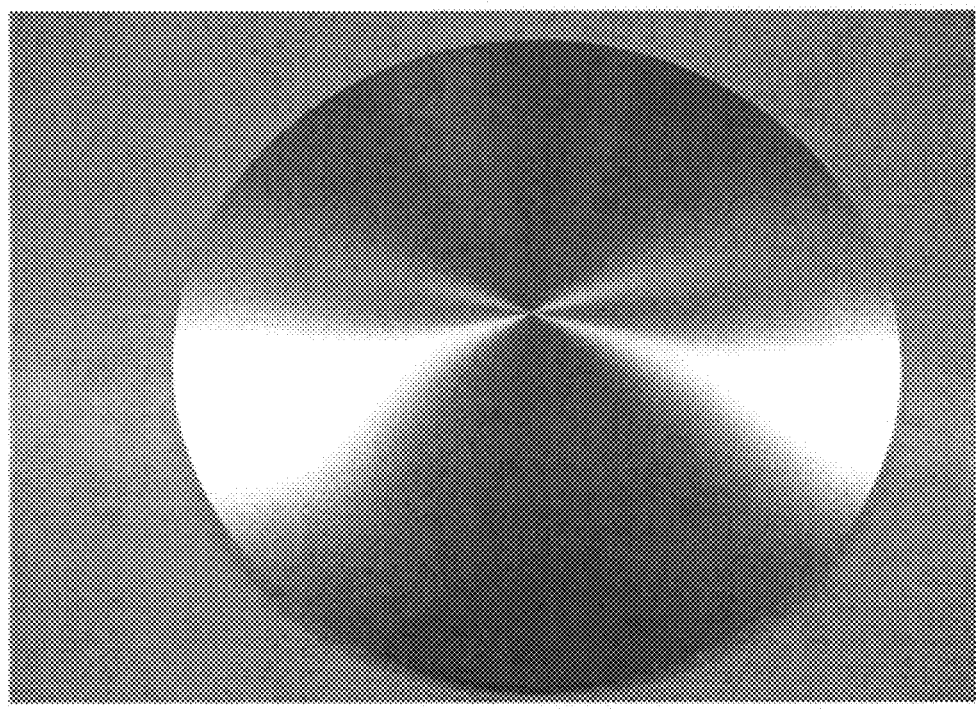
Figure 3:
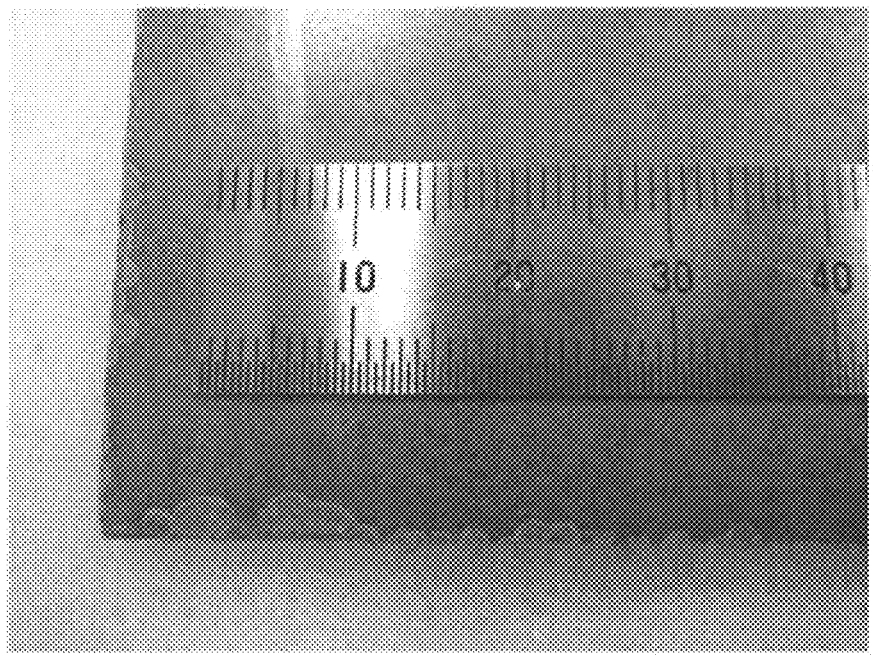
FIG. 3(a) is a photograph illustrating the presence/absence of chipping in Comparative Example 14.
FIG. 3(b) is a photograph illustrating the presence/absence of chipping in Example 9 of the present invention.
Figure 3:
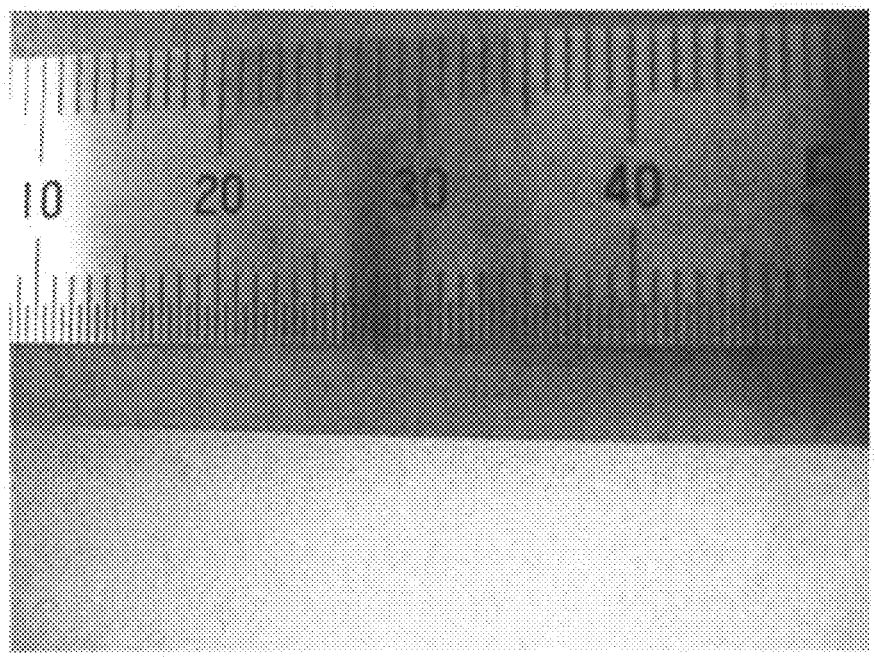
Figure 4:
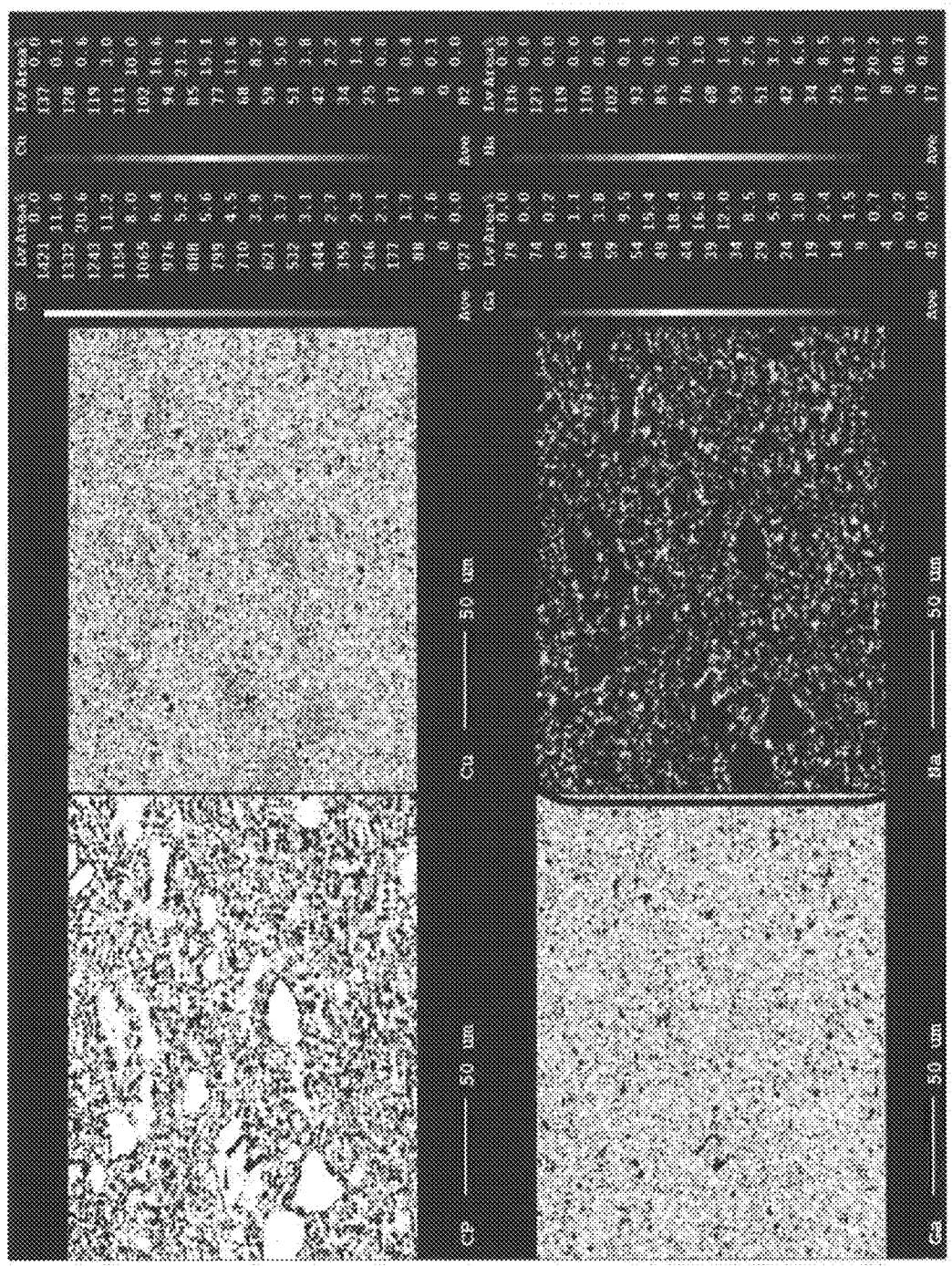
FIG. 4 is a photograph illustrating a composition image (COMP image), a Cu element mapping image, a Ga element mapping image, and a Na element mapping image obtained by an electron-probe micro analyzer (EPMA) in Example 9 of the present invention.

An exemplary enlarged photograph illustrating about 0.05 mm² aggregates in Example 20 of the present invention is shown in FIG. 1(a) and an exemplary enlarged photograph illustrating 0.05 mm² or larger aggregates in Example 21 of the present invention is shown in FIG. 1(b). Photographs illustrating the target surfaces in Comparative Example 16 in which spots and color irregularities occurred and in Example 5 in which spots and color irregularities did not occur are shown in FIGS. 2(a) and 2(b), respectively. Furthermore, photographs in Comparative Example 14 in which chipping occurred during processing and in Example 9 in which no chipping occurred during processing are shown in FIGS. 3(a) and 3(b), respectively, for comparison. In Example 9, element distribution mapping images obtained by an electron probe micro analyzer (EPMA) are shown in FIG. 4. All of the original images of these EPMA images were color images but were converted into monochromatic images by gray scale. The content of Cu, Ga, and Na tends to be high as the brightness increases.

Figure 5:
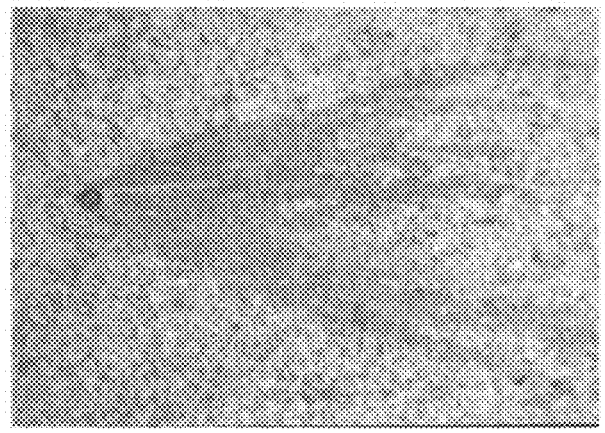
FIG. 5 is a photograph illustrating markings of significant abnormal, electrical discharge observed on the used sputtering surface in Comparative Example 1.

Furthermore, FIG. 5 is a photograph illustrating markings of significant abnormal electrical discharge observed on the sputtering surface of the used target in Comparative Example 1.

In order to apply the present invention to a sputtering target, it is preferable that the sputtering target has a surface roughness of 5 μm or less and has a concentration of metallic impurities of 0.1 at % or less. These conditions are satisfied in all of the Examples.

The technical scope of the present invention is not limited to the aforementioned embodiments and Examples, but the present invention may be modified in various ways without departing from the scope or teaching of the present invention.

What is claimed is:

1. A sputtering target having a component composition that contains 10 to 40 at % of Ga and 1.0 to 15 at % of Na as metal element components other than F, S, and Se, with the remainder composed of Cu and unavoidable impurities, wherein
   the Na is contained in the form of at least one Na compound selected from sodium fluoride, sodium sulfide, and sodium selenide,
   the sputtering target has a theoretical density ratio of 90% or higher,
   a flexural strength of 100 N/mm² or higher,
   a bulk resistivity of 1 mΩ·cm or less,
   a content of oxygen of 200 to 2000 ppm, and
   the number of 0.05 mm² or larger aggregates of the Na compound present per cm² area of the target surface is 1 or less on average.

2. The sputtering target according to claim 1, wherein the sputtering target has a structure in which a Na compound phase is dispersed in a target material and the average particle diameter of the Na compound phase is 10 μm or less.

3. The sputtering target according to claim 1, wherein the average particle diameter of a metal phase in the target material is 20 μm or less.

4. A method for producing the sputtering target according to claim 1, the method comprising:
   a step of drying an Na compound powder at a temperature of 70° C. or higher prior to preparing a powder mixture of Na compound powder into the powder and Cu—Ga powder,
   a step of sintering the powder mixture,
   wherein
   the Cu—Ga powder is composed of Cu—Ga alloy powder or Cu—Ga alloy powder and Cu powder,
   the average particle diameter of the Cu—Ga powder is 1 to 45 μm, and
   the proportion of the Cu—Ga powder particles having a particle diameter of 30 μm or less is over half of the total powder weight of the Cu—Ga powder.

5. The method for producing a sputtering target according to claim 1, the method comprising:
   a step of sintering a powder mixture of Na compound powder and Cu—Ga powder,
   a step of drying the powder mixture at a temperature of 70° C. or higher,
   wherein the Cu—Ga powder is composed of Cu—Ga alloy powder or Cu—Ga alloy powder and Cu powder, the average particle diameter of the Cu—Ga powder is 1 to 45 μm, and the proportion of the Cu—Ga powder particles having a particle diameter of 30 μm or less is over half of the total powder weight of the Cu—Ga powder.

6. The method for producing a sputtering target according to claim 4, the method comprising: sintering the powder mixture in a non-oxidizing atmosphere or in a vacuum in the step of sintering the powder mixture.

* * * * *